(12) United States Patent
Kashihara et al.

(10) Patent No.: US 11,059,260 B2
(45) Date of Patent: Jul. 13, 2021

(54) PREPREG, METAL-CLAD LAMINATED BOARD, AND PRINTED WIRING BOARD

(71) Applicant: PANASONIC INTELLECTUAL PROPERTY MANAGEMENT CO., LTD., Osaka (JP)

(72) Inventors: Keiko Kashihara, Osaka (JP); Takashi Hoshi, Fukushima (JP); Hiroharu Inoue, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 401 days.

(21) Appl. No.: 16/316,579

(22) PCT Filed: Jul. 19, 2017

(86) PCT No.: PCT/JP2017/026113
§ 371 (c)(1),
(2) Date: Jan. 9, 2019

(87) PCT Pub. No.: WO2018/021113
PCT Pub. Date: Feb. 1, 2018

(65) Prior Publication Data
US 2019/0263087 A1    Aug. 29, 2019

(30) Foreign Application Priority Data
Jul. 29, 2016  (JP) .............................. JP2016-150047

(51) Int. Cl.
*B32B 5/02*    (2006.01)
*B32B 15/14*   (2006.01)
(Continued)

(52) U.S. Cl.
CPC .............. *B32B 5/024* (2013.01); *B32B 15/08* (2013.01); *B32B 15/092* (2013.01); *B32B 15/14* (2013.01);
(Continued)

(58) Field of Classification Search
CPC ............ C08L 63/00–10; C08L 33/068; B32B 15/082; B32B 15/092; B32B 5/024; C08K 9/06
See application file for complete search history.

(56) References Cited

U.S. PATENT DOCUMENTS

2014/0367150 A1    12/2014 Inoue et al.
2015/0075852 A1    3/2015 Inoue et al.
(Continued)

FOREIGN PATENT DOCUMENTS

JP    2006-137942 A    6/2006
JP    2007-138152 A    6/2007
(Continued)

OTHER PUBLICATIONS

International Search Report and Written Opinion issued in International Patent Application No. PCT/JP2017/026113, dated Sep. 5, 2017; with partial English translation.

*Primary Examiner* — Kregg T Brooks
(74) *Attorney, Agent, or Firm* — McDermott and Emery LLP

(57) ABSTRACT

A prepreg including: a woven cloth substrate; and a semi-cured product of a resin composition. The resin composition contains: at least one of an (A1) component and an (A2) component, a (B) component; a (C1) component; and a (C2) component. The (A1) component is an epoxy resin having at least one of a naphthalene skeleton and a biphenyl skeleton. The (A2) component is a phenol resin having at least one of
(Continued)

a naphthalene skeleton and a biphenyl skeleton. The (B) component is a high molecular weight polymer. The (C1) component is a first filler obtained by treating surfaces of a first inorganic filler with a first silane coupling agent represented by formula (c1). The (C2) component is a second filler obtained by treating surfaces of a second inorganic filler with a second silane coupling agent represented by formula (c2).

[Chemical formula 1]

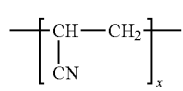

(b1)

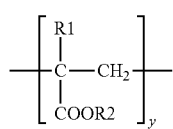

(b2)

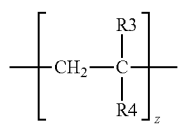

(b3)

[Chemical formula 2]

$(R6)Si(R5)_3$ (c1)

[Chemical formula 3]

$(R8)Si(R7)_3$ (c2)

16 Claims, 6 Drawing Sheets

(51) Int. Cl.

| | | |
|---|---|---|
| *C08J 5/24* | (2006.01) | |
| *H05K 1/03* | (2006.01) | |
| *B32B 15/08* | (2006.01) | |
| *B32B 15/092* | (2006.01) | |
| *C08L 63/00* | (2006.01) | |
| *C08K 3/36* | (2006.01) | |
| *C08K 5/5399* | (2006.01) | |
| *C08K 9/06* | (2006.01) | |

(52) U.S. Cl.
CPC ............... *C08J 5/24* (2013.01); *C08L 63/00* (2013.01); *H05K 1/03* (2013.01); *H05K 1/0366* (2013.01); *H05K 1/0373* (2013.01); *B32B 2260/021* (2013.01); *B32B 2260/046* (2013.01); *B32B 2262/0269* (2013.01); *B32B 2262/101* (2013.01); *B32B 2457/08* (2013.01); *C08J 2361/06* (2013.01); *C08J 2363/00* (2013.01); *C08K 3/36* (2013.01); *C08K 5/5399* (2013.01); *C08K 9/06* (2013.01); *C08K 2201/005* (2013.01); *C08K 2201/011* (2013.01); *H05K 2201/012* (2013.01); *H05K 2201/0257* (2013.01)

(56) References Cited

U.S. PATENT DOCUMENTS

| | | |
|---|---|---|
| 2015/0282302 A1 | 10/2015 | Hoshi et al. |
| 2016/0366761 A1 | 12/2016 | Hoshi et al. |
| 2017/0218150 A1 | 8/2017 | Matsumoto et al. |

FOREIGN PATENT DOCUMENTS

| | | |
|---|---|---|
| JP | 2008-007756 A | 1/2008 |
| JP | 2011-162615 A | 8/2011 |
| JP | 2014-070156 A | 4/2014 |
| JP | 2015-082535 A | 4/2015 |
| JP | 2015-189834 A | 11/2015 |
| JP | 2016-210856 A | 12/2016 |
| JP | 2017-002305 A | 1/2017 |
| WO | 2014/141689 A1 | 9/2014 |
| WO | 2016/031205 A1 | 3/2016 |

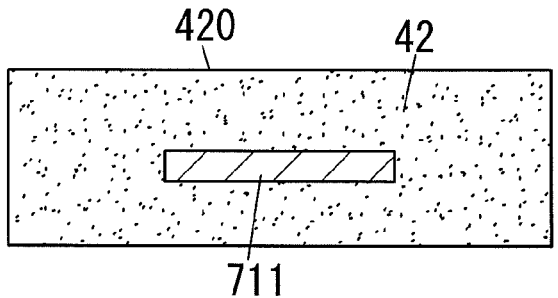
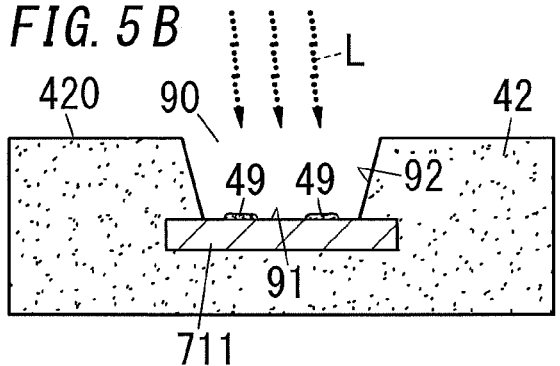
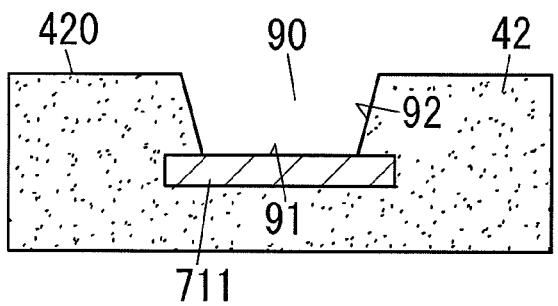
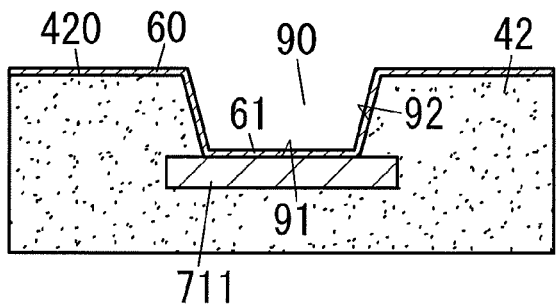
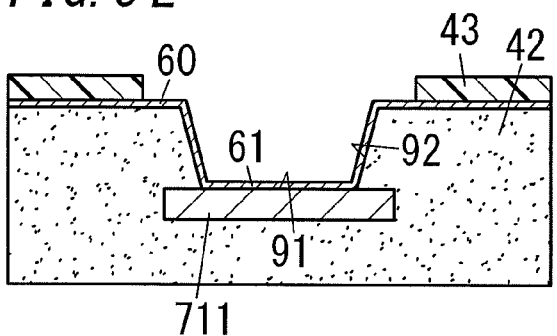
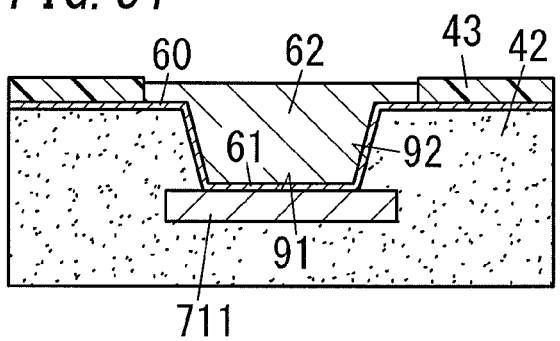
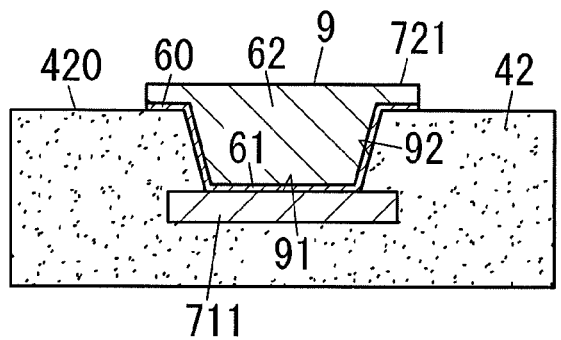

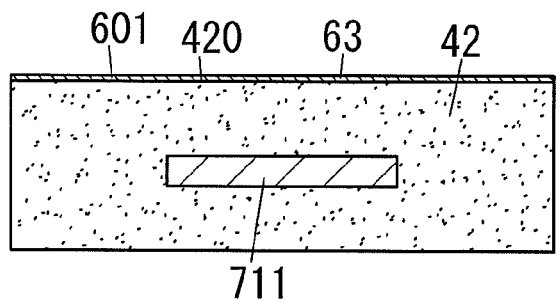
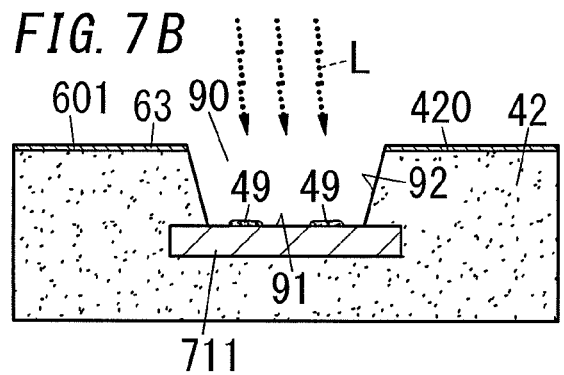
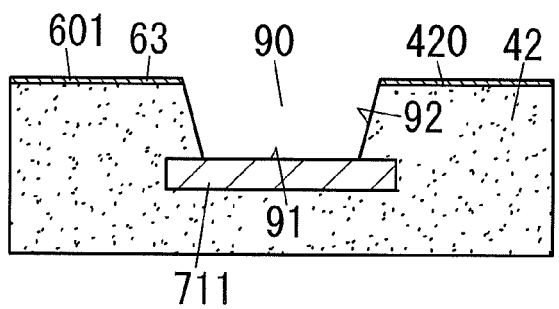
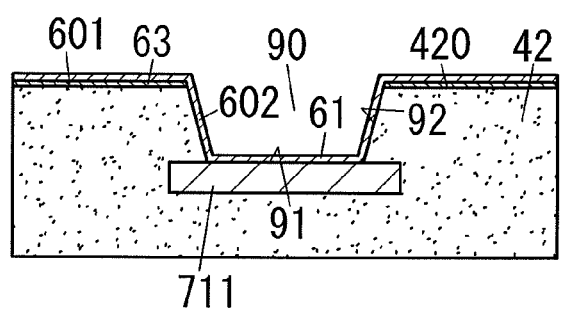
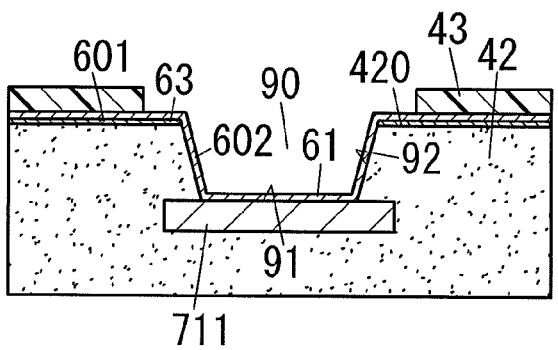
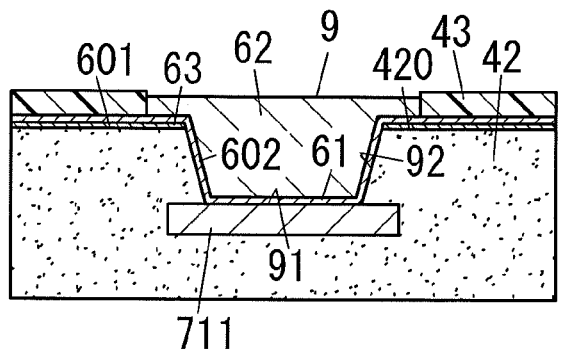
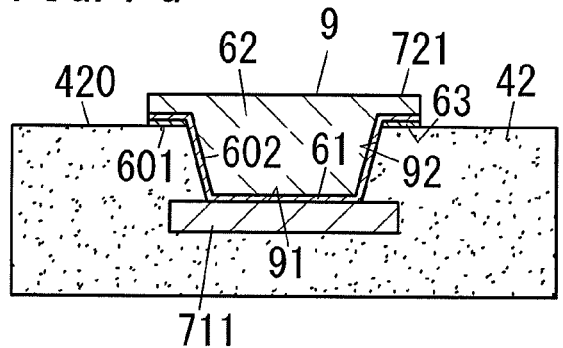

FIG. 9A Example 1
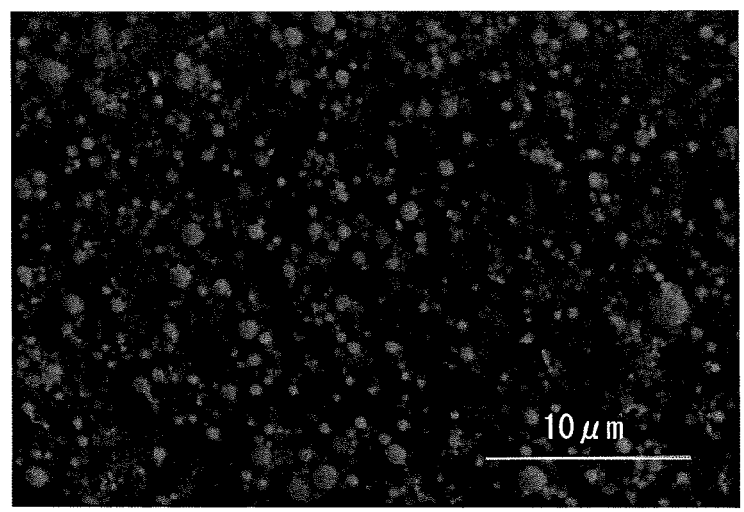
FIG. 9B Comparative Example 1
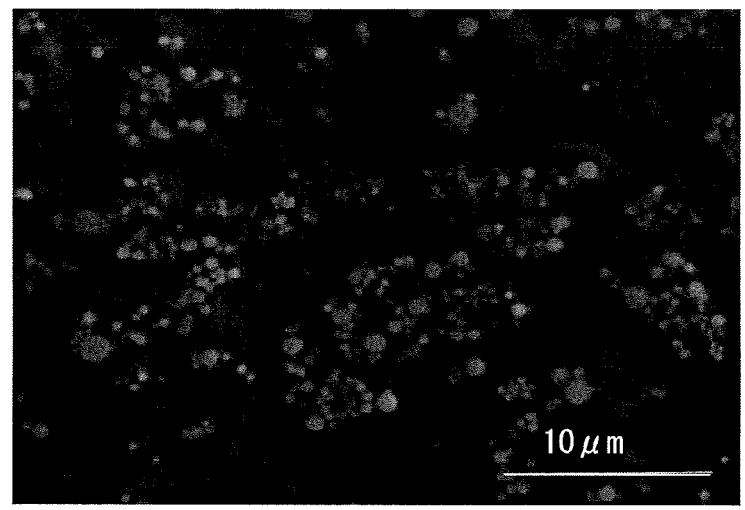

PREPREG, METAL-CLAD LAMINATED BOARD, AND PRINTED WIRING BOARD

CROSS-REFERENCE OF RELATED APPLICATIONS

This application is the U.S. National Phase under 35 U.S.C. § 371 of International Patent Application No. PCT/JP2017/026113, filed on Jul. 19, 2017, which in turn claims the benefit of Japanese Application No. 2016-150047, filed on Jul. 29, 2016, the entire disclosures of which Applications are incorporated by reference herein.

TECHNICAL FIELD

The present invention generally relates to prepregs, metal-clad laminated boards, and printed wiring boards, and especially relates to a prepreg including a woven cloth substrate and a semi-cured product of the resin composition, a metal-clad laminated board formed from the resin composition, and a printed wiring board formed using the metal-clad laminated board.

BACKGROUND ART

Conventionally, a prepreg is formed by impregnating a resin composition containing a thermosetting resin into a woven cloth substrate and heating and drying thereof until the resin composition is semi-cured (for example, refer to patent literatures 1 to 3). Then, a metal-clad laminated board can be obtained by stacking a metal foil on the prepreg obtained by the aforementioned method and heating and pressurizing thereof for molding. Further, a printed wiring board can be obtained by removing unnecessary parts of the metal foil of the metal-clad laminated board and thereby forming a conductive pattern. After that, a semi-conductor element is mounted on the printed wiring board which is then sealed and thereby a package is obtained.

In recent years, a PoP (Package on Package) is named as a package widely used for smartphones and tablets. In the PoP, multiple sub-packages are stacked and therefore it is important that the sub-packages has good mountability and that each of the sub-packages has good reliability in electric conductivity. In addition, the less warpage in absolute value of the package (including the sub-packages) at room temperature becomes and the less an amount of change in warpage when an atmospheric temperature is changed from room temperature to 260° C., the more such mountability and reliability in electric conductivity are improved. Therefore, currently, board materials such that warpage of the package is reduced are being widely developed.

Currently proposed board materials such that warpage of the package is reduced are materials developed in terms of high rigidity and low coefficient of thermal expansion. In other words, it is proposed that the higher the rigidity is and the lower the coefficient of thermal expansion (CTE) is, the smaller the warpage of the package becomes.

In a case where a thickness of an insulating layer of a printed wiring board used to obtain a package is smaller than 0.2 mm, an amount of moisture absorption by such thin insulating layer is small. Therefore, even when the insulating layer is heated by soldering, the resin composing the insulating layer has strength high enough for swelling of the insulating layer to be prevented.

However, in a case where the thickness of the insulating layer is larger than or equal to 0.2 mm, an amount of moisture absorption by such thick insulating layer becomes large. When the moisture absorbed by the insulating layer evaporates due to heating by soldering, the resin composing the insulating layer is ruptured and swelling of the insulating layer occurs. Accordingly, there has existed a problem that heat resistance after moisture absorption of a conventional thick printed wiring board is especially low.

CITATION LIST

Patent Literature

Patent Literature 1: JP 2006-137942 A
Patent Literature 2: JP 2007-138152 A
Patent Literature 3: JP 2008-007756 A

SUMMARY OF INVENTION

The present disclosure aims to provide a prepreg, a metal-clad laminated board, and a printed wiring board in which heat resistance after moisture absorption is improved.

A prepreg according to one embodiment of the present disclosure includes: a woven cloth substrate; and a semi-cured product of a resin composition impregnated into the woven cloth substrate.

The resin composition contains: at least one of an (A1) component and an (A2) component; a (B) component; a (C1) component; and a (C2) component.

The (A1) component is an epoxy resin having at least one of a naphthalene skeleton and a biphenyl skeleton.

The (A2) component is a phenol resin having at least one of a naphthalene skeleton and a biphenyl skeleton.

The (B) component is a high molecular weight polymer which has a structure represented by at least a (b2) formula and a (b3) formula out of a (b1) formula, the (b2) formula, and the (b3) formula and has a weight average molecular weight of 200000 to 850000.

[Chemical formula 1]

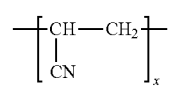 (b1)

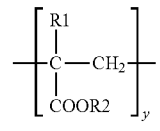 (b2)

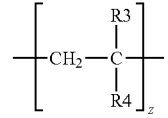 (b3)

x in the (b1) formula, y in the (b2) formula and z in the (b3) formula satisfies a following relationship, x:y:z (molar fraction)=0:0.95:0.05 to 0.2:0.6:0.2 (note that x+y+z≤1, 0≤x≤0.2, 0.6≤y≤0.95, and 0.05≤z≤0.2 being satisfied). In the (b2) formula, R1 includes a hydrogen atom or a methyl group, and R2 includes at least one of a glycidyl group and an epoxylated alkyl group out of a hydrogen atom, an alkyl group, a glycidyl group, and an epoxylated alkyl group. In the (b3) formula, R3 is a hydrogen atom or a methyl group, and R4 is Ph (a phenyl group), —COOCH$_2$Ph, or —COO(CH$_2$)$_2$Ph.

The (C1) component is a first filler obtained by treating surfaces of a first inorganic filler with a first silane coupling agent represented by a (c1) formula.
[Chemical Formula 2]

(R6)Si(R5)₃ (c1)

In the (c1) formula, R5 is a methoxy group or an ethoxy group, and R6 has an isocyanate group, a glycidyl group, or an amino group at an end of an aliphatic alkyl group with the number of carbon atoms larger than or equal to 3 and smaller than or equal to 18.

The (C2) component is a second filler obtained by treating surfaces of a second inorganic filler with a second silane coupling agent represented by a (c2) formula.
[Chemical Formula 3]

(R8)Si(R7)₃ (c2)

In the (c2) formula, R7 is a methoxy group or an ethoxy group, and R8 has a methacryloyl group or a vinyl group at an end of an aliphatic alkyl group with the number of carbon atoms larger than or equal to 3 and smaller than or equal to 18

A metal-clad laminated board according to one embodiment of the present disclosure includes: a cured product of the prepreg; and a metal foil bonded to the cured product.

A printed wiring board according to one embodiment of the present disclosure includes: a cured product of the prepreg: and a conductive pattern provided on the cured product.

BRIEF DESCRIPTION OF DRAWINGS

FIG. 5A is a schematic cross sectional view representing a step of a semi-additive method.

FIG. 5B is a schematic cross sectional view representing a step of a semi-additive method. FIG. 5C is a schematic cross sectional view representing a step of a semi-additive method. FIG. 5D is a schematic cross sectional view representing a step of a semi-additive method. FIG. 5E is a schematic cross sectional view representing a step of a semi-additive method. FIG. 5F is a schematic cross sectional view representing a step of a semi-additive method. FIG. 5G is a schematic cross sectional view representing a step of a semi-additive method.

FIG. 7A is a schematic cross sectional view representing a step of a modified semi-additive method. FIG. 7B is a schematic cross sectional view representing a step of a modified semi-additive method. FIG. 7C is a schematic cross sectional view representing a step of a modified semi-additive method. FIG. 7D is a schematic cross sectional view representing a step of a modified semi-additive method. FIG. 7E is a schematic cross sectional view representing a step of a modified semi-additive method. FIG. 7F is a schematic cross sectional view representing a step of a modified semi-additive method. FIG. 7G is a schematic cross sectional view representing a step of a modified semi-additive method.

FIG. 9A is an electron microscope image representing a dispersing of an inorganic filler of example 1. FIG. 9B is an electron microscope image representing a dispersing of an inorganic filler of comparative example 1.

DESCRIPTION OF EMBODIMENTS

[Prepreg]

Figure 1:
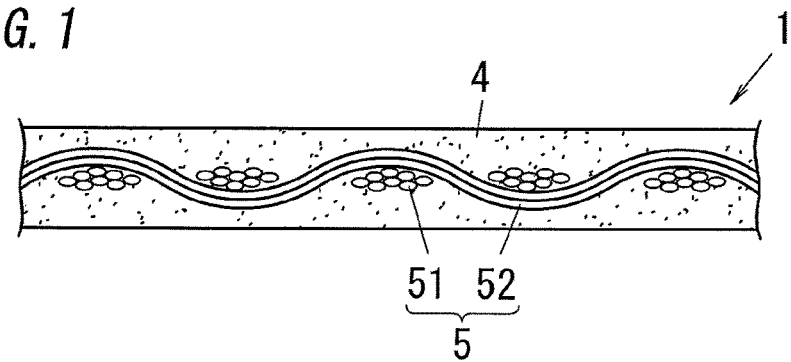
FIG. 1 is a schematic cross sectional view representing a prepreg according to one embodiment of the present disclosure.

FIG. 1 represents a prepreg 1 according to the present embodiment. The prepreg 1 includes: a woven cloth substrate 5; and a semi-cured product 4 of a resin composition impregnated into the woven cloth substrate 5.

The semi-cured product 4 of the resin composition is defined as the resin composition in a middle stage of a curing reaction. The middle stage is also referred to as a B stage, which is a stage between an A stage where the resin composition is in a form of varnish and a C stage where the resin composition is completely cured. When the resin composition in the B stage is further heated, the resin composition melts once and then cures completely, forming a cured product of the resin composition. Note that the prepreg 1 is in a semi-cured state means that the resin composition composing the prepreg 1 is in a semi-cured state. Also, the prepreg 1 is in a cured state means that the resin composition composing the prepreg 1 is in a cured state.

The resin composition is explained. The resin composition contains at least one of an (A1) component below and an (A2) component below. In other words, the resin composition may contain both of the (A1) component and the (A2) component, the resin composition may contain the (A1) component while not containing the (A2) component, and the resin composition may contain the (A2) component while not containing the (A1) component. The resin composition further contains a (B) component below, a (C1) component below, and a (C2) component below. Hereinafter, each component composing the resin composition is explained one by one.

The (A1) component is explained. The (A1) component is a matrix resin which is a highly rigid component. Specifically, the (A1) component is an epoxy resin having at least one of a naphthalene skeleton and a biphenyl skeleton. As explained, the epoxy resin used as the (A1) component may have both of a naphthalene skeleton and a biphenyl skeleton, may have a naphthalene skeleton while not having a biphenyl skeleton, and may have a biphenyl skeleton while not having a naphthalene skeleton. Hereinafter, the epoxy resin which has a naphthalene skeleton and does not have a biphenyl skeleton is referred to as a naphthalene skeleton-containing epoxy resin. Also, the epoxy resin which has a biphenyl skeleton and does not have a naphthalene skeleton is referred to as a biphenyl skeleton-containing epoxy resin.

The (A2) component is explained. The (A2) component is also a matrix resin which is a highly rigid component. Specifically, the (A2) component is a phenol resin having at least one of a naphthalene skeleton and a biphenyl skeleton. The phenol resin used as the (A2) component may have both of a naphthalene skeleton and a biphenyl skeleton, may have a naphthalene skeleton while not having a biphenyl skeleton, and may have a biphenyl skeleton while not having a naphthalene skeleton. Hereinafter, the phenol resin which has a naphthalene skeleton and does not have a biphenyl skeleton is referred to as a naphthalene skeleton-containing phenol resin. Also, the phenol resin which has a biphenyl skeleton and does not have a naphthalene skeleton is referred to as a biphenyl skeleton-containing phenol resin.

As explained above, since both of the (A1) component and the (A2) component have at least one of a naphthalene skeleton and a biphenyl skeleton, heat resistance (for example, solder heat resistance) of a cured product of the prepreg 1 can be improved. Since a naphthalene skeleton is an especially rigid skeleton, when at least one of the (A1) component and the (A2) component has a naphthalene skeleton, the heat resistance of the cured product of the prepreg 1 can be further improved. Since the prepreg 1 is used as a material for a metal-clad laminated board 2, a printed wiring board 3, and a package, heat resistance of the metal-clad laminated board 2, the printed wiring board 3, and the package, can also be improved. Note that both of the metal-clad laminated board 2 and the printed wiring board 3 may be referred to as a board.

The (B) component is explained. The (B) component is a low elastic component and is, for example, an epoxy-modified acryl resin. Specifically, the (B) component has a structure represented by at least a (b2) formula and a (b3) formula out of a (b1) formula below, the (b2) formula below, and the (b3) formula below

[Chemical formula 4]

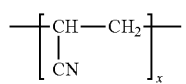

(b1)

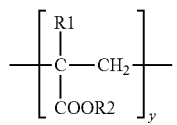

(b2)

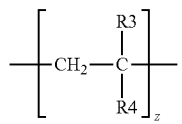

(b3)

x in the (b1) formula, y in the (b2) formula and z in the (b3) formula satisfies a following relationship, x:y:z (molar fraction)=0:0.95:0.05 to 0.2:0.6:0.2 (note that x+y+z≤1, 0≤x≤0.2, 0.6≤y≤0.95, and 0.05≤z≤0.2 being satisfied). In the (b2) formula, R1 includes a hydrogen atom or a methyl group, and R2 includes at least one of a glycidyl group and an epoxylated alkyl group out of a hydrogen atom, an alkyl group, a glycidyl group, and an epoxylated alkyl group. In the (b3) formula, R3 is a hydrogen atom or a methyl group, and R4 is Ph (a phenyl group), —COOCH$_2$Ph, or —COO(CH$_2$)$_2$Ph.

In other words, a main chain of the (B) component has a structure represented by at least the (b2) formula and the (b3) formula out of the (b1) formula, the (b2) formula, and the (b3) formula.

In a case where the main chain of the (B) component has a structure represented by the (b1) formula, the (b2) formula, and the (b3) formula, a sequential order of a structure represented by the (b1) formula, a structure represented by the (b2) formula, and a structure represented by the (b3) formula is not especially limited. In this case, two or more of the structure represented by the (b1) formula may be consecutively adjacent to each other or may be not consecutive in the main chain of the (B) component. Also, two or more of the structure represented by the (b2) formula may be consecutively adjacent to each other or may be not consecutive in the main chain of the (B) component. Similarly, two or more of the structure represented by the (b3) formula may be consecutively adjacent to each other or may be not consecutive in the main chain of the (B) component.

In a case where the main chain of the (B) component has a structure represented by the (b2) formula and the (b3) formula, a sequential order of the structure represented by the (b2) formula and the structure represented by the (b3) formula is not especially limited. In this case, two or more of the structure represented by the (b2) formula may be consecutively adjacent to each other or may be not consecutive in the main chain of the (B) component. Also, two or more of the structure represented by the (b3) formula may be consecutively adjacent to each other or may be not consecutive in the main chain of the (B) component.

Now, a supplementary explanation is added on a meaning that R2 in the (b2) formula includes at least one of a glycidyl group and an epoxylated alkyl group out of a hydrogen atom, an alkyl group, a glycidyl group, and an epoxylated alkyl group. As a premise, one R2 exists in the structure represented by one (b2) formula. The explanation is made separately on a case where the (B) component has one structure represented by the (b2) formula and a case where the (B) component has two or more structures represented by the (b2) formula.

In the first case, i.e., in the case where the (B) component has one structure represented by the (b2) formula, R2 is a glycidyl group or an epoxylated alkyl group.

In the second case, i.e., in the case where the (B) component has two or more structures represented by the (b2) formula, R2 in at least one of the structures represented by the (b2) formula in the (B) component is a glycidyl group or an epoxylated alkyl group. R2 in the rest of the structures represented by the (b2) formula in the (B) component is a hydrogen atom or an alkyl group. Since R2 in at least one of the structures represented by the (b2) formula in the (B) component is a glycidyl group or an epoxylated alkyl group, R2 in all of the structures represented by the (b2) formula in the (B) component may be a glycidyl group or an epoxylated alkyl group.

The structure represented by the (b3) formula has Ph (a phenyl group), —COOCH$_2$Ph, or —COO(CH$_2$)$_2$Ph. Since Ph (a phenyl group), —COOCH$_2$Ph, and —COO(CH$_2$)$_2$Ph are thermally stable, strength of the cured product of the prepreg 1 can be improved. Therefore, heat resistance after moisture absorption of the board obtained by using the prepreg 1 as a material can be improved.

The (B) component preferably does not have an unsaturated bond such as a double bond and a triple bond between adjacent carbon atoms. In other words, the adjacent carbon atoms in the (B) component are preferably bonded by a saturated bond (a single bond). In this case, oxidation over time can be reduced and thus the cured product of the prepreg 1 is prevented from becoming fragile due to loss of elasticity.

The (B) component is a high molecular weight polymer which has a weight average molecular weight of 200000 to 850000. Significant figures of the weight average molecular weight are two. A value of the weight average molecular weight which becomes 200000 or 850000 when rounded to two significant figures is included in the above range of the 200000 to 850000. When the weight average molecular weight of the (B) component is smaller than 200000, chemical resistance of the cured product of the resin composition might become poor. On the other hand, when the weight average molecular weight of the (B) component is larger than 850000, moldability of the resin composition might become poor. The weight average molecular weight of the (B) component is preferably within a range of 300000 to 500000.

Since the resin composition contains the (B) component, the cured product of the prepreg 1 tends not to absorb moisture, and thereby moisture resistance of the board can be improved, leading to improvement in insulation reliability. Also, even if the cured product of the prepreg 1 absorbs moisture, since rupture strength of the resin composing the cured product is improved, the heat resistance after moisture absorption of the board can be improved. Especially, even in a thick printed wiring board having an insulating layer with a thickness of larger than or equal to 0.2 mm, since the heat resistance after moisture absorption is improved, the insulating layer is prevented from swelling due to heat by soldering. As a matter of course, the heat resistance after moisture absorption is improved in a thin printed wiring board having an insulating layer with a thickness of smaller than 0.2 mm.

The (A1) component and the (A2) component are preferably not miscible with the (B) component and are preferably phase-separated from the (B) component in the semi-cured state and the cured state of the resin composition. In this case, lowering of a glass transition temperature (Tg) of the cured product of the prepreg 1 is prevented, and the heat resistance (for example, the solder heat resistance) of the board and the package can be improved.

An epoxy value of the (B) component is preferably within a range of 0.01 to 0.80 eq/kg. An epoxy value is defined as a equivalent number of epoxy groups which exist in 1 kg of the (B) component. When the epoxy value of the (B) component is within the above range, the (A1) component and the (A2) component tend not to be miscible with the (B) component, and thereby the lowering of the glass transition temperature (Tg) of the cured product of the prepreg 1 is prevented and the heat resistance of the board and the package can be improved. The epoxy value of the (B) component is more preferably within a range of 0.06 to 0.40 eq/kg and further preferably within a range of 0.14 to 0.28 eq/kg.

The (C1) component is explained. The (C1) component is a first filler obtained by treating surfaces of a first inorganic filler with a first silane coupling agent represented by a (c1) formula below. In other words, the first inorganic filler is an aggregation of fine particles, and a reactive group (silanol generated by hydrolysis of a methoxy group or an ethoxy group) of the first silane coupling agent represented by the (c1) formula is chemically bonded to a surface of each of the fine particles. Accordingly, the first filler as the (C1) component is formed.

[Chemical Formula 5]

$$(R5)Si(R5)_3 \qquad (c1)$$

In the (c1) formula, R5 is a methoxy group or an ethoxy group, and R6 has an isocyanate group, a glycidyl group, or an amino group at an end of an aliphatic alkyl group with the number of carbon atoms larger than or equal to 3 and smaller than or equal to 18, Specific examples of the first inorganic filler may include spherical silica, barium sulfate, powdery silicon oxide, crushed silica, calcined talc, barium titanate, titanium dioxide, clay, alumina, mica, boehmite, zinc borate, zinc stannate, other metal oxides, and other metal hydrates.

The resin composition preferably does not contain an inorganic filler having an average particle size of larger than or equal to 45 μm. In a case where such coarse particles are contained in the resin composition, the insulation reliability might lower especially in a thin material (such as the prepreg 1, the metal-clad laminated board 2, and the printed wiring board 3). Note that an average particle size is defined as a median particle size in a particle size distribution measured by a laser diffraction/scattering method.

The first silane coupling agent represented by the (c1) formula is a tri-functional alkoxy silane in which an aliphatic alkyl group of a certain number of carbon atoms having a specific functional group (an isocyanate group, a glycidyl group, or an amino group) at its end is bonded to a silicon atom.

Specific examples of a silane coupling agent having an isocyanate group at an end of an aliphatic alkyl group may include 3-isocyanate propyl triethoxy silane.

Specific examples of a silane coupling agent having a glycidyl group at an end of an aliphatic alkyl group may include 3-glycidoxy propyl trimethoxy silane, 3-glycidoxy propyl triethoxy silane, and 3-glycidoxy octyl trimethoxy silane.

Specific examples of a silane coupling agent having an amino group at an end of an aliphatic alkyl group may include N-2-(aminoethyl)-3-amino propyl trimethoxy silane, 3-amino propyl trimethoxy silane, 3-amino propyl triethoxy silane, and N-phenyl-3-amino propyl trimethoxy silane.

Since the first inorganic filler is surface treated with the first silane coupling agent represented by the (c1) formula, an aliphatic alkyl group of a certain number of carbon atoms exists on surfaces of the particles of the first filler. An isocyanate group, a glycidyl group, or an amino group is bonded to an end of the aliphatic alkyl group. Reactive groups such as an isocyanate group, a glycidyl group, and an amino group are highly affinitive with the epoxy resin which is the (A1) component and the phenol resin which is the (A2) component. Therefore, these reactive groups can contribute to chemical bonds between: the first filler which is the (C) component; and the epoxy resin which is the (A1) component and the phenol resin which is the (A2) component. Note that even though the (B) component is epoxy-modified (refer to the (b2) formula), since an amount of epoxy groups in the (B) component is small, the (B) component has a low affinity with the (C1) component. Therefore, the (A1) component, the (A2) component, and the (B) component tend to have structures such that the (A1) component and the (A2) component are not miscible and are phase-separated from the (B) component in the semi-cured state and the cured state of the resin composition.

The number of carbon atoms of an aliphatic alkyl group in the reaction group R6 of the first silane coupling agent represented by the (c1) formula is larger than or equal to 3 and smaller than or equal to 18. When the number of carbon atoms of an aliphatic alkyl group is less than 3, the elasticity of the cured product of the prepreg 1 becomes too large.

The (C2) component is explained. The (C2) component is a second filler obtained by treating surfaces of a second inorganic filler with a second silane coupling agent represented by a (c2) formula below. In other words, the second inorganic filler is an aggregation of fine particles, and a reactive group (a methoxy group or an ethoxy group) of the second silane coupling agent represented by the (c2) formula is chemically bonded to a surface of each of the fine particles. Accordingly, the second filler as the (C2) component is formed.

[Chemical Formula 6]

$$(R8)Si(R7)_3 \qquad (c2)$$

In the (c2) formula, R7 is a methoxy group or an ethoxy group, and R8 has a methacryloyl group or a vinyl group at an end of an aliphatic alkyl group with the number of carbon atoms larger than or equal to 3 and smaller than or equal to 18.

Specific examples of the second inorganic filler may be same with the first inorganic filler, i.e., the specific examples of the second inorganic filler may include the specific examples of the first inorganic filler. The first inorganic filler in the (C1) component and the second inorganic filler in the (C2) component may be same material or different materials and may have same average particle size or different average particle sizes.

The second silane coupling agent represented by the (c2) formula is a tri-functional alkoxy silane in which an aliphatic alkyl group of a certain number of carbon atoms having a specific functional group (a methacryloyl group or a vinyl group) at its end is bonded to a silicon atom. Note that a methacryloyl group is also commonly known as a methacryl group.

Specific examples of a silane coupling agent having a methacryloyl group at an end of an aliphatic alkyl group may include 3-methacryloxy propyl trimethoxy silane, 3-methacryloxy propyl triethoxy silane, and 3-methacryloxy octyl trimethoxy silane.

Specific examples of a silane coupling agent having a vinyl group at an end of an aliphatic alkyl group may include vinyl trimethoxy silane and vinyl triethoxy silane.

Since the second inorganic filler is surface treated with the second silane coupling agent represented by the (c2) formula, an aliphatic alkyl group of a certain number of carbon atoms exists on surfaces of the particles of the second filler. A methacryloyl group or a vinyl group is bonded to an end of the aliphatic alkyl group. Reactive groups such as a methacryloyl group and a vinyl group are highly affinitive with the (B) component. Therefore, these reactive groups can contribute to chemical bonds between the second filler which is the (C2) component and the (B) component.

The number of carbon atoms of an aliphatic alkyl group in the reaction group R8 of the second silane coupling agent represented by the (c2) formula is larger than or equal to 3 and smaller than or equal to 18. When the number of carbon atoms of an aliphatic alkyl group is less than 3, the elasticity of the cured product of the prepreg 1 becomes too large.

In general, in a cured product of a resin composition containing a resin and an inorganic filler, the resin tends to absorb more moisture compared to the inorganic filler. Due to this, if the inorganic filler is not evenly dispersed in the cured product of the resin composition, a part of the cured product where the inorganic filler is scarce and the resin is abundant absorbs an increased amount of moisture, while a part of the cured product where the inorganic filler is abundant and the resin is scarce absorbs less moisture. In other words, if the dispersion of the inorganic filler is uneven, dispersion of absorbed moisture becomes also uneven. When a test of the heat resistance after moisture absorption is carried out on the cured product of such resin composition, unevenly existing moisture in the cured product evaporates, leading to generation of swelling.

On the other hand, in the present embodiment, the heat resistance after moisture absorption is improved by using two kinds of the filler (the first filler and the second filler) which are obtained by treating surfaces of the two kinds of the inorganic filler (the first inorganic filler and the second inorganic filler) with two kinds of the silane coupling agent (the first silane coupling agent and the second silane coupling agent). The first filler which is the (C1) component has the high affinity with the epoxy resin which is the (A1) component and the phenol resin which is the (A2) component, while the second filler which is the (C2) component has the high affinity with the (B) component. Due to that, the first filler which is the (C1) component and the second filler which is the (C2) component tend not to unevenly gather around either one of: the (A1) component and the (A2) component; and the (B) component. In other words, the first filler and the second filler tend to disperse evenly throughout the curing product of the resin composition. Accordingly, moisture can be evenly absorbed by the curing product. As a result, moisture is less likely to exist unevenly in the cured product, and thereby the generation of swelling is prevented, leading to the improvement in the heating resistance after moisture absorption.

Also, since the resin composition contains the first filler which is the (C1) component and the second filler which is the (C2) component, a size stability of the board can be improved.

Hereinafter, explanations common to both of the first filler which is the (C1) component and the second filler which is the (C2) component are made. Note that both of the first filler and the second filler are simply referred to as the filler. Both of the first inorganic filler and the second inorganic filler are simply referred to as the inorganic filler. Both of the first silane coupling agent represented by the (c1) formula and the second silane coupling agent represented by the (c2) formula are simply referred to as the silane coupling agent.

An aliphatic alkyl group functions to reduce stress generated during thermal expansion or thermal shrinkage of the cured prepreg 1. Since the surfaces of the inorganic filler are treated with the silane coupling agent, a stress reducing layer due to the aliphatic alkyl groups are formed on the surfaces of the inorganic filler. Since the filler having the stress reducing layer exists in the (A1) component, (A2) component, and the (B) component, the stress due to the thermal expansion or the thermal shrinking reducing effect is exerted on the (A1) component, (A2) component, and the (B) component. Accordingly, deformation due to heat is less likely to occur in the cured prepreg 1 which contains the filler. Therefore, the heat resistance after moisture absorption of the board can be improved. There are several reasons for the stress reducing effect contributed by the existence of the aliphatic alkyl groups on the surfaces of the filler. One of the reasons is that since the single bonds in an alkyl group can rotate freely, thermal expansion or thermal shrinkage also occurs in the alkyl groups of the filler along with the thermal expansion or the thermal shrinkage of the (A1) component, the (A2) component, and the (B) component.

Further, an aliphatic alkyl group can function to reduce an etching amount in a desmear treatment (a desmear etching)

carried out after making holes in the metal-clad laminated board 2 which is formed by using the prepreg 1 as a material.

Note that the desmear treatment means removing the resin smear generated while making the holes by a laser processing or a drill processing, by a chemical hole cleaning. Specific examples of the desmear treatment may include a permanganic acid treatment. In the permanganic acid treatment, a desmear solution whose main ingredient is alkaline potassium permanganate is used.

The above mentioned etching amount is defined as an amount of the resin removed by the desmear etching. If the etching amount is large, an inner diameter of a hole formed by the hole making step might increase. Therefore, the etching amount is preferably as small as possible.

As mentioned above, since the aliphatic alkyl groups exist on the surfaces of the filler, the desmear solution can be prevented from going into the inside of the cured product of the resin composition and thereby the etching amount can be reduced. Accordingly, the enlargement of the hole size can be prevented even though the desmear treatment is carried out.

The aliphatic alkyl group in the filler has an isocyanate group, a glycidyl group, an amino group, a methacryloyl group, or a vinyl group at its end, and such functional groups can bond strongly with the (A1) component, the (A2) component, or the (B) component. Due to this, the etching amount in the desmear treatment can be reduced. In this case, the etching amount in the desmear treatment can be reduced compared to a case where the aliphatic alkyl group in the filler does not have an isocyanate group, a glycidyl group, an amino group, a methacryloyl group, or a vinyl group at its end.

Examples of a method for the surface treatment of the inorganic filler with the silane coupling agent may include a direct treatment method, an integral blend method, and a dry concentrate method. When treating the surfaces of the inorganic filler with the silane coupling agent, an amount of the silane coupling agent with respect to an amount of the inorganic filler is not especially limited. An amount of the silane coupling agent required to form a single molecular layer of the silane coupling agent entirely on each of the surfaces of the inorganic filler can be calculated by the following formula (1). A preferable amount of the silane coupling agent actually used is 0.1 to 15 times of the calculated value. In this case, the inorganic filler functions to reduce the stress more efficiently.

$$W_C = W_F \times S_F / S_C \tag{1}$$

$W_C$: the amount of the silane coupling agent required to form a single molecular layer of the silane coupling agent (g)
$W_F$: an amount of the inorganic filler used (g)
$S_F$: a specific surface area of the inorganic filler (m²/g)
$S_C$: a minimum coverage area of the silane coupling agent (m²/g)

The (C1) component or the (C2) component is preferably a nanofiller having an average particle size of smaller than or equal to 100 nm. More preferably, the (C1) component or the (C2) component is a nanofiller having an average particle size of larger than or equal to 10 nm and smaller than or equal to 100 nm. When the average particle size of the (C1) component or the (C2) component is smaller than or equal to 100 nm, an effect of removing the resin smear during the desmear treatment can be improved, which is further explained in detail below. A main component of the resin smear is considered to be the (B) component which is the high molecular weight polymer. In a first case where the (C1) component or the (C2) component is the nanofiller specified above, the nanofiller is evenly dispersed in the resin smear. Such resin smear can be removed easily by the desmear treatment. In a second case where neither the (C1) component nor the (C2) component is the nanofiller specified above, the resin smear is composed mainly of the resin component. Such resin smear can be removed by the desmear treatment with the more harsh treatment condition compared to the first case; however, such resin smear cannot be easily removed by the desmear treatment with the same condition as the first case. In other words, in the desmear treatment with the same condition, the resin smear can be removed more easily in a case where the average particle size of the (C1) component or the (C2) component is smaller than or equal to 100 nm, compared to a case where the average particle sizes of both of the (C1) component and the (C2) component are larger than 100 nm. The reason for this is considered that as above explained, the nanofiller with the average particle size of smaller than or equal to 100 nm is dispersed evenly in the resin smear. When the average particle size of the (C1) component or the (C2) component is larger than or equal to 10 nm, thickening of the resin composition in a form of varnish can be prevented. Note that both of the first filler and the second filler with the average particle size of smaller than or equal to 100 nm are simply referred to as the nanofiller.

In the resin composition, a weight ratio of a total of the (A1) component and the (A2) component to the (B) component is preferably within a range of 90:10 to 50:50, and more preferably within a range of 80:20 to 60:40. In other words, an amount of the (B) component is preferably within a range of 10 to 50 parts by mass and more preferably within a range of 20 to 40 parts by mass, with respect to 100 parts by mass of a total of the (A1) component, the (A2) component, and the (B) component. A hydroxyl equivalent of the phenol resin in the (A2) component is preferably within a range of 0.2 to 1.1, with respect to 1 epoxy equivalent of the epoxy resin in the (A1) component. A total amount of the (C1) component and the (C2) component is preferably less than or equal to 80 weight % and more preferably less than or equal to 50 weight %, with respect to a total amount of the resin composition. In this case, the total amount of the (C1) component and the (C2) component is defined as a total amount of the (C1) component and the (C2) component including the silane coupling agent after the surface treatment when the surfaces of each of the (C1) component and the (C2) component are treated with the certain silane coupling agent. A ratio (weight ratio) of the (C1) component to the (C2) component is preferably within a range of 98:2 to 60:40 and more preferably within a range of 95:5 to 80:20. In other words, an amount of the (C2) component is preferably within a range of 2 to 40 parts by mass and more preferably within a range of 5 to 20 parts by mass, with respect to 100 parts by mass of the total of the (C1) component and the (C2) component.

If the (C1) component or the (C2) component is the nanofiller, an amount of the nanofiller is preferably within a range of 1 to 30 parts by mass and more preferably within a range of 3 to 10 parts by mass with respect to 100 parts by mass of a total of the (A1) component, the (A2) component, and the (B) component. When the amount of the nanofiller is larger than or equal to 1 parts by mass, the effect of removing the resin smear in the desmear treatment can be improved. More specifically, in the desmear treatment with the same condition, the resin smear can be removed more easily in a case where the nanofiller is larger than or equal to 1 parts by mass, compared to a case where the nanofiller is less than 1 parts by mass. When the amount of the nanofiller is less than or equal to 30 parts by mass, the thickening of the resin composition in a form of varnish can be prevented.

The resin composition may further contain an additive. Specific examples of the additive may include a phosphorus flame retardant. When the resin composition contains the phosphorus flame retardant, the flame retardancies of the cured product of the prepreg 1, the board, and the package can be improve. Note that the phosphorus flame retardant is likely to absorb moisture; however, since two kinds of the filler obtained by treating the surfaces of two kinds of the inorganic filler with two kinds of the silane coupling agent are used in the present embodiment, the heat resistance after moisture absorption can be improved. The phosphorus flame retardant has little influence on the dispersibility of the inorganic filler. When the resin composition is used to manufacture a small product (for example, a package), there is not a large need for providing the flame retardancy; however, when the resin composition is used to manufacture a large product (for example, a mother board), there is a large need for providing the flame retardancy. Therefore, in the latter case, the resin composition preferably contains the phosphorus flame retardant.

The resin composition may further contain a curing accelerator. Specific examples of the curing accelerator may include: imidazoles and derivatives thereof; organic phosphorus compounds; metal soaps such as zinc octoate; secondary amines; tertiary amine; and quaternary ammonium salts.

Figure 2:
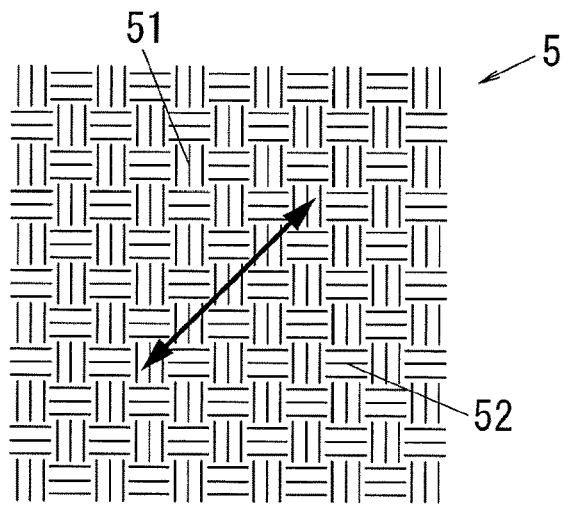
FIG. 2 is a schematic plan view representing a woven cloth substrate of the prepreg shown in the FIG. 1.

The woven cloth substrate 5 is explained. The woven cloth substrate 5 is not especially limited as long as it is woven so that warp 51 and weft 52 are weaved almost orthogonally as in a plain weave drawn in FIG. 2. Specific examples of the woven cloth substrate 5 may include a cloth made from inorganic fibers such as a glass cloth and a cloth made from organic fibers such as aramid cloth. A thickness of the woven cloth substrate 5 is preferably within a range of 10 to 200 μm.

Next, the properties of the prepreg 1 of the present embodiment are explained.

A chart of loss tangent (tan δ) is obtained by carrying out a dynamic mechanical analysis (DMA) on a sample of the cured product of the prepreg 1. In this chart (a tan δ curve), one peak preferably exists in each of a temperature range of lower than or equal to 100° C. and a temperature range of higher than or equal to 200° C. More preferably, one peak exists in each of a temperature range of lower than or equal to 60° C. and a temperature range of higher than or equal to 200° C. The peak existing in the temperature range of higher than or equal to 200° C. is a main dispersion peak. The main dispersion peak is related to motions of the main chain in the molecular structure of the cured product and caused by the glass transition temperature (Tg). On the other hand, the peak existing in the temperature range of lower than or equal to 100° C. or in the temperature range of lower than or equal to 60° C. is a sub dispersion peak. The sub dispersion peak is related to motions of the side chains in the molecular structure of the cured product and caused by the high molecular weight polymer which is the (B) component. When the sub dispersion peak shifts from the higher temperature range of lower than or equal to 100° C. to the lower temperature range of lower than or equal to 60° C., the cured product can gain a high elongation property and a further low elasticity.

The above dynamic mechanical analysis is carried out under a stable frequency (for example, 10 Hz). The loss tangent (tan δ) is a ratio of loss modulus (E") to storage modulus (E'). In other words, the loss tangent (tan δ)=loss modulus (E")/storage modulus (E'). The chart of the loss tangent (tan δ) is a chart having a vertical axis of the loss tangent (tan δ) and a horizontal axis of the temperature, indicating the temperature dependency of the loss tangent (tan δ).

Under the cured condition of the prepreg 1, the ratio of the loss modulus (E") to the storage modulus (E') is preferably larger than or equal to 0.05 in a temperature range of lower than or equal to 100° C. and a temperature range of higher than or equal to 200° C., and more preferably larger than or equal to 0.05 in a temperature range of lower than or equal to 60° C. and a temperature range of higher than or equal to 200° C. Especially preferably, peak values of the loss tangent (tan δ) in both of the temperature range of lower than or equal to 100° C. and the temperature range of higher than or equal to 200° C. are larger than or equal to 0.05. Further preferably, peak values of the loss tangent (tan δ) in both of the temperature range of lower than or equal to 60° C. and the temperature range of higher than or equal to 200° C. are larger than or equal to 0.05.

When one peak of larger than or equal to 0.05 exists in each of the temperature range of lower than or equal to 100° C. and the temperature range of higher than or equal to 200° C., the properties from both of the highly rigid components of the (A1) component and the (A2) component and the low elastic components of the (B) component can coexist. As explained earlier, when the sub dispersion peak shifts from the higher temperature range of lower than or equal to 100° C. to the lower temperature range of lower than or equal to 60° C., the cured product can gain the high elongation property and the further low elasticity.

A tensile elongation percentage of the prepreg 1 under the cured condition in a oblique direction of 45° to the warp 51 or weft 52 of the woven cloth substrate 5 (for example, in a direction of a double arrow drawn in FIG. 2) is preferably larger than or equal to 5%. In general, a piece of the prepreg 1 under the cured state (under the C-stage state) is used as a sample to a measurement of the tensile elongation percentage; however, a sample of multiple pieces of the prepreg 1 stacked so that the warp 51 and weft 52 of each piece are in the same direction may be used. The measurement of the tensile elongation percentage can be carried out by a tensile test in the following manner. First, a length ($L_0$) of the sample in the oblique direction of 45° to the warp 51 or the weft 52 is measured before the tensile test. In this step, a width of the sample should be adjusted to 5 mm. Then, using a tensile test device, the sample is pulled in the oblique direction of 45° to the warp 51 or the weft 52 at a speed of 5 mm/min until the sample is torn apart. A length (L) of the sample right before the sample is torn apart is measured. The tensile elongation percentage can be calculated by the following formula (2).

$$\text{Tensile elongation percentage (\%)}=\{(L-L_0)/L_0\}\times 100 \qquad (2)$$

When the tensile elongation percentage calculated by the above formula is larger than or equal to 5%, the warpage of the package can be further reduced.

[Manufacturing Method of Prepreg]

First, a varnish of the prepreg is prepared. The (A1) component, the (A2) component, and the (B) component are dissolved in a solvent, and the additives and the curing accelerator are added if necessary to prepare a base varnish. Examples of the solvent may include: ketone solvents such as acetone, methylethyl ketone, cyclohexanone; aromatic solvents such as toluene and xylene; and nitrogen-containing solvents such as dimethyl formamide. Next, the (C1) component and the (C2) component are added to and dispersed in the base varnish to prepare the varnish of the resin composition. In order to disperse the (C1) component and the (C2) component in the varnish, a dispersing device such as a homogenizer, a disper, and a beads mill may be used.

Then, the resin composition in the form of the varnish (in the A-stage state) is impregnated into the woven cloth substrate 5 and then heated and dried until the varnish is semi-cured to the semi-cured state (in the B-state state). Accordingly, the prepreg 1 is obtained.

[Metal-Clad Laminated Board]

Figure 3:
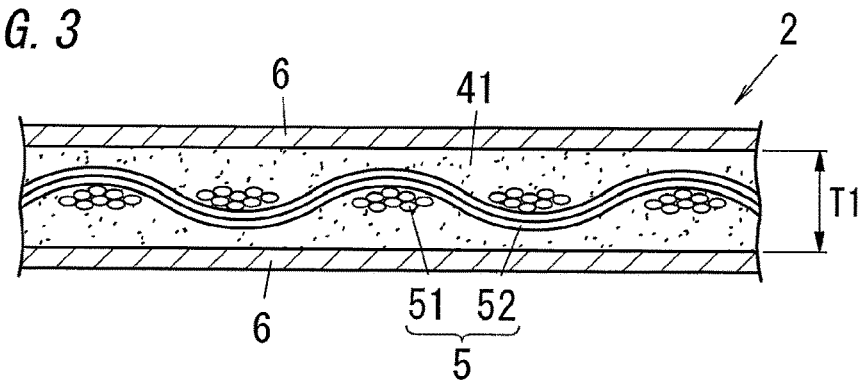
FIG. 3 is a schematic cross sectional view representing a metal-clad laminated board according to one embodiment of the present disclosure.

The metal-clad laminated board 2 of the present embodiment includes the cured product of the prepreg 1 and a metal foil 6 bonded to the cured product. Specifically, as shown in FIG. 3, the metal foil 6 is bonded to a surface of an insulating layer 41 which is formed by curing the prepreg 1 (more specifically the semi-cured product 4 of the resin composition), and thereby the metal-clad laminated board 2 is formed. In this case, the metal foil 6 may be stacked either on one surface of the one piece of the prepreg 1 or on both surfaces of the one piece of the prepreg 1, which can be then heated and pressurized for molding. The metal foil 6 may also be stacked either on one surface of a stack of multiple pieces of the prepreg 1 or on both surfaces of the stack of multiple pieces of the prepreg 1, which can be then heated and pressurized for molding. The prepreg 1 in the semi-cured state is heated and formed into the insulating layer 41 in the cured-state as explained above. The heat resistance after moisture absorption of the metal-clad laminated board 2 can be improved even in a case where a thickness T1 of the insulating layer 41 is larger than or equal to 0.2 mm, not to mention in a case where the thickness T1 of the insulating layer 41 is less than 0.2 mm. A maximum value of the thickness T1 of the insulating layer 41 of the metal-clad laminated board 2 is around 0.4 mm. Examples of the metal foil 6 may include a copper foil. Stack molding can be carried out by, for example, heating and pressurizing using a multi-step vacuum press and a double belt press.

[Printed Wiring Board]

Figure 4:
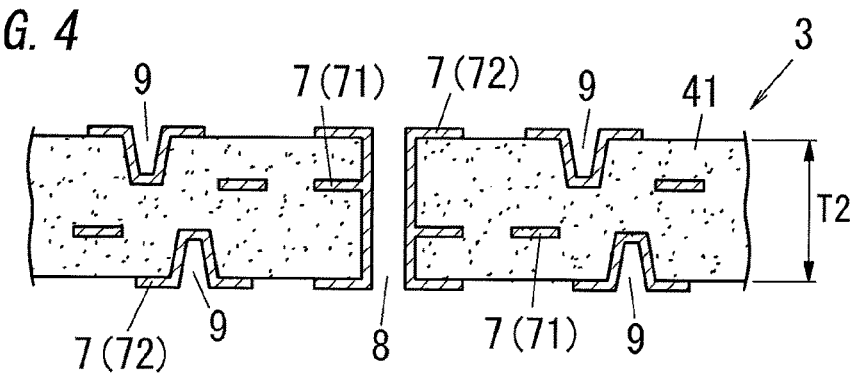
FIG. 4 is a schematic cross sectional view representing a printed wiring board according to one embodiment of the present disclosure.

The printed wiring board 3 includes: the cured product of the prepreg 1 and a conductive pattern 7 provided on the cured product. The conductive pattern 7 can be formed by removing some parts of the metal foil 6 of the metal-clad laminated board 2. The conductive pattern 7 can be formed by, for example, a subtractive method. An example of the printed wiring board 3 is shown in FIG. 4. This printed wiring board 3 is a multi-layer printed wiring board whose conductive pattern 7 is formed by the subtractive method and which is multi-layered by a build-up method. The conductive pattern 7 inside the insulating layer 41 is an inner layer pattern 71, and the conductive pattern 7 on an outer surface of the insulating layer 41 is an outer layer pattern 72. The heat resistance after moisture absorption of the printed wiring board 3 can be improved even in a case where a thickness T2 of the insulating layer 41 is larger than or equal to 0.2 mm, not to mention in a case where the thickness T2 of the insulating layer 41 is less than 0.2 mm. A maximum value of the thickness T2 of the insulating layer 41 of the metal-clad laminated board 2 is around 0.4 mm. Note that the woven cloth substrate 5 is not drawn in FIG. 4.

When forming the conductive pattern 7, holes are formed in the insulating layer 41 for interlayer connection. The interlayer connection is defined as an electric connection between conductive layers 7 formed on different layers. The hole may be a through hole which penetrates through the printed wiring board and may be a non-through hole (a blind hole) which does not penetrate through the printed wiring board 3. As shown in FIG. 4, a via hole 8 may be formed by plating an inner surface of the through hole and a blind via hole 9 may be formed by plating an inner surface of the non-through hole. A buried via hole, which is not shown in the figures, may also be formed. An inner diameter of the hole is, for example, within a range of 0.01 to 0.20 mm. A depth of the hole is, for example, within a range of 0.02 to 0.80 mm. The holes may be formed by a laser processing or a drill processing.

Since the fillers of the (C1) component and the (C2) component are contained in the insulating layer 41 and the functional group at an end of the aliphatic alkyl group of the silane coupling agent is an isocyanate group, a glycidyl group, an amino group, a methacryloyl group, or a vinyl group, the etching amount in the desmear treatment can be reduced. Even when the resin smear is generated, the resin smear in the hole can be further removed by cleaning inside the hole by the desmear treatment such as chemical hole cleaning. Accordingly, conductive failure due to the resin smear can be prevented, leaded to an improvement of the reliability in electric conductivity.

Since the fillers of the (C1) component and the (C2) component are contained in the insulating layer 41, the aliphatic alkyl groups of the silane coupling agent functions as the stress reducing layer. Accordingly, the coefficient of thermal expansion of the printed wiring board 3 can be reduced. In addition, the elasticity of the printed wiring board 3 can be lowered and the high elongation property can be provided to the printed wiring board 3. Due to these, the heat resistance after moisture absorption of the printed wiring board 3 can be further improved.

Two kinds of methods which can be employed to form the blind via hole 9 are explained. The two kinds of methods are a semi additive process (SAP) and a modified semi additive process (MSAP).

First, the SAP is explained, referring to FIG. 5A to FIG. 5G.

FIG. 5A illustrates an insulating layer 42 which has an inner layer pattern 711 inside and a main surface 420 outside.

First, as illustrated in FIG. 5B, a hole which is a non-through hole 90 is formed on the insulating layer 42. The hole can be formed by the laser processing. Specific examples of the laser L may include a $CO_2$ laser and a UV-YAG laser. The non-through hole 90 has an opening on a side of the main surface 420 of the insulating layer 42. A bottom surface 91 of the non-through hole 90 is a surface of the inner layer pattern 711. When making the hole, the resin smear 49 is generated. The resin smear 49 is attached to the surface of the inner later pattern 711 which is the bottom surface 91 of the non-through hole 90.

Next, in order to remove the above resin smear 49, the desmear treatment is carried out as shown in FIG. 5C. When carrying out the desmear treatment, the main surface 420 of the insulating layer 42, an inner side surface 92 of the non-through hole 90, and the bottom surface 91 of the non-through hole 90 are roughened, as well as the resin smear 49 is removed from the bottom surface 91 of the non-through hole 90 and the inner side surface 92 of the non-through hole 90.

Then, as illustrated in FIG. 5D, an electroless plating treatment is performed on the main surface 420 of the insulating layer 42, the bottom surface 91 of the non-through hole 90, and the inner side surface 92 of the non-through hole 90, in order to form an electroless plating layer 61 which functions as a seed layer 60.

After that, as illustrated in FIG. 5E, a plating resist 43 is formed on the main surface 420 of the insulating layer 42. The plating resist 43 is formed on a part of the main surface 420 of the insulating layer 42 where the outer layer pattern 721 is not formed.

Subsequently, as illustrated in FIG. 5F, a part which is not masked by the plating resist 43 is filled with a plating 62 by an electrolytic plating treatment.

Then, as illustrated in FIG. 5G, the plating resist 43 is removed, and the seed layer 60 positioned between the plating resist 43 and the main surface 420 of the insulating layer 42 is removed by etching. Thereby the blind via hole 9 which electrically connects the inner layer pattern 711 and the outer layer pattern 721 is formed. Since the blind via hole 9 is filled with the plating 62, the blind via hole 9 is also called as a filled via.

Figure 6A:
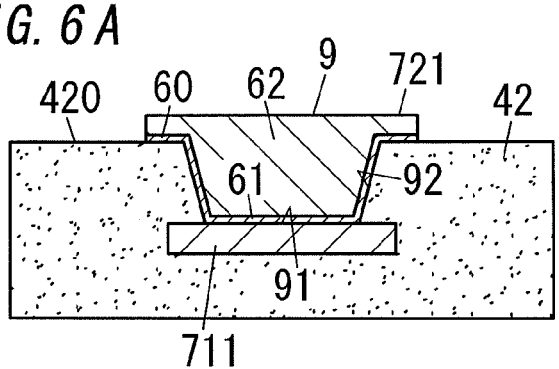
FIG. 6A is a schematic cross sectional view representing a condition where resin smear is not remained between an inner layer pattern and plating after a semi-additive method is carried out.
Figure 6B:
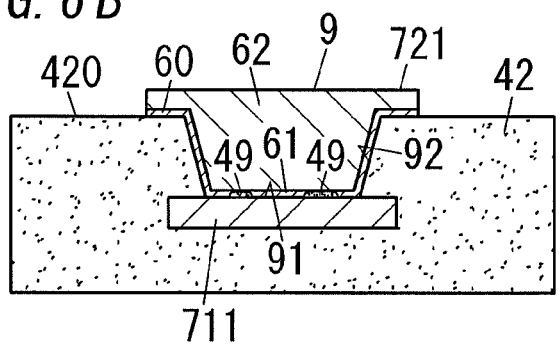
FIG. 6B is a schematic cross sectional view representing a condition where resin smear is remained between an inner layer pattern and plating after a semi-additive method is carried out.

If the insulating layer 42 does not contain the combination of the (C1) component and the (C2) component, as illustrated in FIG. 6B, a filled via in which the resin smear 49 remains between the inner layer pattern 711 and the electroless plating layer 61 might be formed. The resin smear 49 is remainder of the resin smear which is not removed by the desmear treatment. If the resin smear 49 remains, the conductive failure might occur due to the resin smear 49, leading to loss of the reliability in electric conductivity.

On the other hand, as in the present embodiment, in a case where the fillers of both of the (C1) component and the (C2) component are contained in the insulating layer 42, a filled via in which the resin smear 49 does not remain between the inner layer pattern 711 and the electroless plating layer 61 can be formed after the SAP is carried out as illustrated in FIG. 6A. In other words, the resin smear 49 can be easily removed by the desmear treatment. Accordingly, the conductive failure due to the resin smear 49 can be prevented and the reliability in electric conductivity can be improved. Note that a case where the resin smear 49 does not remain includes a case where the resin smear 49 does not remain at all and a case where the resin smear 49 remains a little to an extent which does not affect the reliability in electric conductivity.

The MSAP is explained referring to FIG. 7A to FIG. 7G.

FIG. 7A illustrates an insulating layer 42 which has an inner layer pattern 711 inside and a main surface 420 outside. A very thin metal foil 63 which functions as a first seed layer 601 is provided on the main surface 420.

First, as illustrated in FIG. 7B, a hole which is a non-through hole 90 is formed on the insulating layer 42 including the first seed layer 601. The hole can be formed by the laser processing. Specific examples of the laser L may include a $CO_2$ laser and a UV-YAG laser. The non-through hole 90 has an opening on a side of the main surface 420 of the insulating layer 42. A bottom surface 91 of the non-through hole 90 is a surface of the inner layer pattern 711. When making the hole, the resin smear 49 is generated. The resin smear 49 is attached to the surface of the inner later pattern 711 which is the bottom surface 91 of the non-through hole 90.

Next, in order to remove the above resin smear 49, the desmear treatment is carried out as shown in FIG. 7C. When carrying out the desmear treatment, the first seed layer 601 provided on the main surface 420 of the insulating layer 42, an inner side surface 92 of the non-through hole 90, and the bottom surface 91 of the non-through hole 90 are roughened, as well as the resin smear 49 is removed from the bottom surface 91 of the non-through hole 90 and the inner side surface 92 of the non-through hole 90.

Then, as illustrated in FIG. 7D, an electroless plating treatment is performed on the first seed layer 601 provided on the main surface 420 of the insulating layer 42, the bottom surface 91 of the non-through hole 90, and the inner side surface 92 of the non-through hole 90, in order to form an electroless plating layer 61 which functions as a second seed layer 602.

After that, as illustrated in FIG. 7E, a plating resist 43 is formed on the main surface 420 of the insulating layer 42. The plating resist 43 is formed on a part of the main surface 420 of the insulating layer 42 where the outer layer pattern 721 is not formed.

Subsequently, as illustrated in FIG. 7F, a part which is not masked by the plating resist 43 is filled with a plating 62 by an electrolytic plating treatment.

Then, as illustrated in FIG. 7G, the plating resist 43 is removed, and the first seed layer 601 and the second seed layer 602 both positioned between the plating resist 43 and the main surface 420 of the insulating layer 42 is removed by etching. Thereby the blind via hole 9 which electrically connects the inner layer pattern 711 and the outer layer pattern 721 is formed. Since the blind via hole 9 is filled with the plating 62, the blind via hole 9 is also called as a filled via.

Figure 8A:
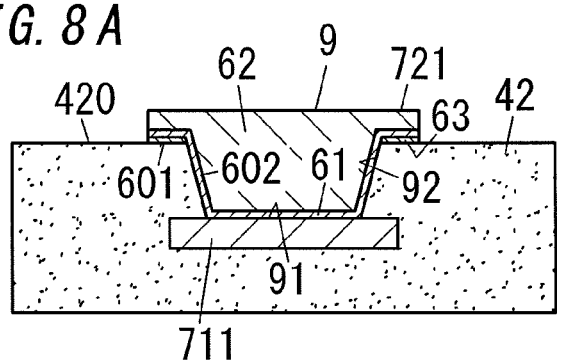
FIG. 8A is a schematic cross sectional view representing a condition where resin smear is not remained between an inner layer pattern and plating after a modified semi-additive method is carried out.
Figure 8B:
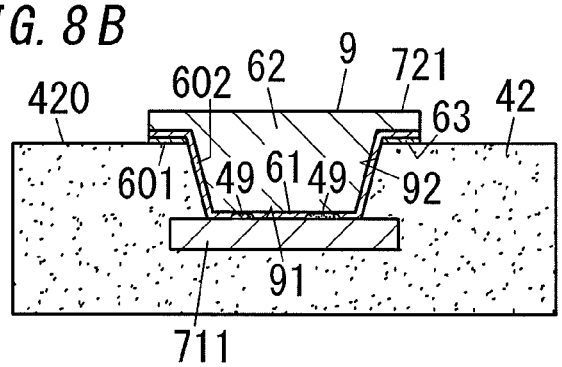
FIG. 8B is a schematic cross sectional view representing a condition where resin smear is remained between an inner layer pattern and plating after a modified semi-additive method is carried out.

If the insulating layer 42 does not contain the combination of the (C1) component and the (C2) component, as illustrated in FIG. 8B, a filled via in which the resin smear 49 remains between the inner layer pattern 711 and the electroless plating layer 61 might be formed. The resin smear 49 is remainder of the resin smear which is not removed by the desmear treatment. If the resin smear 49 remains, the conductive failure might occur due to the resin smear 49, leading to loss of the reliability in electric conductivity.

On the other hand, as in the present embodiment, in a case where the fillers of both of the (C1) component and the (C2) component are contained in the insulating layer 42, a filled via in which the resin smear 49 does not remain between the inner layer pattern 711 and the electroless plating layer 61 can be formed after the MSAP is carried out as illustrated in FIG. 8A. In other words, the resin smear 49 can be easily removed by the desmear treatment. Accordingly, the conductive failure due to the resin smear 49 can be prevented and the reliability in electric conductivity can be improved. Note that a case where the resin smear 49 does not remain includes a case where the resin smear 49 does not remain at all and a case where the resin smear 49 remains a little to an extent which does not affect the reliability in electric conductivity.

[Package]

A semi-conductor element is mounted on the printed wiring board 3 which is then sealed and thereby a package such as a fine pitch ball grid array (FBGA) can be obtained. A package such as a package on package can be obtained by stacking multiple sub packages using the package as a sub package. Accordingly, various kinds of packages can be obtained. Any of these packages includes the (A1) component, the (A2) component, and the (B) component, and therefore, the warpage of the package is reduced and the heat resistance after moisture absorption of the package can be improved. In other words, since the rigidity is improved by the (A1) component and the (A2) component as well as the elasticity is lowered and the stress is reduced by the (B) component, the warpage of the package can be reduced without depending on a kind of the package. Further, the heat resistance after moisture absorption can be improved by the (A1) component, the (A2) component, and the (B) component.

EXAMPLES

Hereinafter, the present invention is more specifically explained, referring to examples.

<Varnish Composition>

(A1) Component

Epoxy resin containing naphthalene skeleton ("HP-9500" manufactured by DIC CORPORATION)

Epoxy resin containing biphenyl skeleton ("NC-3000-H" manufactured by Nippon Kayaku Co., Ltd.

(A2) Component

Phenol resin containing naphthalene skeleton ("HPC-9500P" manufactured by DIC CORPORATION)

Phenol resin containing biphenyl skeleton ("GPH-103" manufactured by Nippon Kayaku Co., Ltd.

(B) Component

Epoxy-modified acryl resin ("PMS-12-82" manufactured by Nagase ChemteX Corporation.)

This compound includes a structure represented by the (b1) formula, the (b2) formula, and the (b3) formula, does not have an unsaturated bond between adjacent carbon atoms, has a weight average molecular weight of 500000, and has an epoxy value of 0.21 eq/kg.

(C1) Component

Isocyanate silane-treated silica

This compound is spherical silica whose surfaces are treated with 3-isocyanate propyl triethoxy silane ("SC2500GNO" manufactured by Admatechs) and which has an average particle size of 0.5 μm (500 nm).

Epoxy silane-treated silica

This compound is spherical silica whose surfaces are treated with 3-glycidoxy propyl trimethoxy silane ("SC2500SEJ" manufactured by Admatechs) and which has an average particle size of 0.5 μm (500 nm).

(C2) Component

Vinyl silane-treated silica

This compound is spherical silica whose surfaces are treated with vinyl trimethoxy silane ("SC2500SVJ" manufactured by Admatechs) and which has an average particle size of 0.5 μm (500 nm).

Methacryl silane-treated silica

This compound is spherical silica whose surfaces are treated with 3-methacryloxy propyl trimethoxy silane ("YA050C-MJE" manufactured by Admatechs) and which has an average particle size of 50 nm.

(Solvent)

Methyl ethyl ketone (Additive)

Phosphorus flame retardant ("SPB-100" manufactured by Otsuka Chemical Co., Ltd.)

<Prepreg>

An (A1) component, an (A2) component, and a (B) component were dissolved in a solvent at amounts (parts by mass) represented in Table 1. After that, an additive was added to the solution, and then a (C1) component and a (C2) component were added and dispersed in the solution to obtain a resin composition in a form of varnish. In the examples 1 to 5, the (A1) component and the (A2) component were not miscible with the (B) component and were phase-separated from the (B) component. Note that dispersibility of the (C1) component and the (C2) component in the varnish was determined by using a laser diffraction particle size distribution measuring device of "SALD-2100" manufactured by Shimadzu Corporation.

Next, the above obtained varnish of the resin composition was impregnated into a woven cloth substrate (glass cloth "WEA116E" manufactured by Nitto Boseki Co., Ltd., thickness of 88 μm) so that a thickness of a prepreg after being cured was to be 100 μm, which was then heated and dried at 130° C. for 5 minutes to the semi-cured state to obtain the prepreg.

<Metal-Clad Laminated Board>

Two pieces of the above obtained prepreg were stacked, and a copper foil (thickness of 12 μm) as a metal foil was stacked on each of both surfaces of the stack, which was then molded by being heated at 220° C. for 60 minutes under pressure of 2.94 MPa (30 kgf/cm$^2$) and under vacuum. Thereby a copper-clad laminated board (CCL) was obtained as a metal-clad laminated board. A thickness of an insulating layer of the metal-clad laminated board was 200 μm. Further, the metal foils on the both surfaces of the metal-clad laminated board were removed by etching and an unclad board with a thickness of 0.2 mm was obtained.

<Board Property>

Following property evaluation tests were performed. The results are shown in Table 1.

(Heat Resistance after Moisture Absorption)

The above obtained unclad board was cut into squares (5 cm by 5 cm) to obtain sample pieces. The edges of the each sample piece was polished and smoothed. The sample piece was then dried in an oven at 100° C. for 1 hour as a pre treatment. After that, the sample pieces absorbed moisture for 0 hour, 12 hours, and 24 hours, respectively, under conditions of 60° C., humidity of 60%, and 1 atm (101.3 kPa). Then the three sample pieces which absorbed moisture for different durations of moisture absorption were soaked in a solder bath at 288° C. for 120 seconds. Then the sample pieces were removed from the solder bath and visually observed to determine whether or not swelling occurred on the sample pieces. In the Table 1, the sample piece on which swelling did not occur is evaluated as "S", the sample piece on which swelling of smaller than or equal to 5 mm occurred is evaluated as "A", the sample piece on which swelling of smaller than or equal to 1 mm occurred is evaluated as "B", and the sample piece on which swelling of larger than 5 mm occurred is evaluated as "C".

(Dispersibility)

The above obtained unclad board was cut, and a cut surface of the cut unclad board was polished. A part of the cut surface of the cut unclad board where the woven cloth substrate did not exist was observed by using an electron microscope (SEM) at 3000 times magnification, and thereby dispersibility of the inorganic filler was evaluated. FIG. 9A is an electron microscope image of the example 1. FIG. 9B is an electron microscope image of the comparative example 1. White parts are the inorganic fillers. It can be observed that the dispersibility is good in FIG. 9A and the dispersibility is poor in FIG. 9B. The results of the examples 2 to 5 were same as the result of the example 1. The result of the comparative example 2 was same as the result of the comparative example 1.

(Peak Top Temperature in Tan δ≥0.05)

The above obtained unclad board was cut out into a rectangle form with a width of 5 mm and a length of 25 mm in an oblique direction (a bias direction) of 45° to a direction of warp of the woven cloth substrate, and thereby a sample piece was obtained. Dynamic mechanical analysis was performed on the sample piece using a dynamic viscoelasticity measuring device ("DMS 6100" manufactured by SII Nano-Technology Inc.) under conditions of a distance between chuckings of 10 mm, a speed of heat raising of 5° C., and tensile mode. Loss tangent (tan δ) chart obtained by the measurement was analyzed to obtain the peak top temperature in a region of tan δ≥0.05.

(Elasticity)

From the loss tangent (tan δ) chart obtained by the above measurement, the storage modulus (E') at 25° C. was determined as the elasticity.

(Coefficient of Thermal Expansion (CTE))

The above obtained unclad board was cut out into a rectangle form with a width of 5 mm and a length of 25 mm in a direction parallel to the direction of warp of the woven cloth substrate, and thereby a sample piece was obtained. Thermo mechanical analysis was performed on the sample piece using a thermo mechanical analysis device ("TMA6100" manufactured by SII NanoTechnology Inc.) under conditions of a distance between probes of 15 mm and a tensile load of 5 mN. An average coefficient of thermal expansion in a temperature range of 50 to 100° C. in an expansion curve obtained by the measurement was used as the coefficient of thermal expansion CTE).

(Tensile Elongation Percentage)

The above obtained unclad board was cut out into a rectangle form with a width of 5 mm and a length of 80 mm in an oblique direction (a bias direction) of 45° to the direction of warp of the woven cloth substrate, and thereby a sample piece was obtained. A tensile test was performed on the sample piece using a tensile test device ("Autograph AGS-X" manufactured by Shimadzu Corporation) under conditions of a distance between marked reference lines of 60 mm and a speed of tensile of 5 mm/min. An initial length ($L_0$) of the sample piece before the tensile test was performed and a length (L) of the sample piece right before the sample piece was torn apart by the tensile test were measured, which were used to calculate the tensile elongation percentage (%) according to the following formula.

Tensile elongation percentage (%)=$\{(L-L_0)/L_0\} \times 100$ (Tensile Rupture Strength)

In the above tensile test, the tensile rupture strength was calculated by the following formula using the load weight F (N) when the sample piece was ruptured and the ruptured surface area S (mm$^2$) of the sample piece.

Tensile rupture strength (MPa)=$F(N)/S(mm^2)$ (Flame Retardancy)

A vertical combustion test was carried out, conforming to UL 94.

TABLE 1

| | | Product number | Manufacturer | Detail | Example 1 | Example 2 | Example 3 | Example 4 | Example 5 | Comparative example 1 | Comparative example 2 |
|---|---|---|---|---|---|---|---|---|---|---|---|
| Varnish composition | (A1) component | HP-9500 | DIC | Epoxy resin containing naphthalene skeleton | 39 | 39 | 39 | 0 | 39 | 39 | 39 |
| | | NC-3000-H | Nippon Kayaku | Epoxy resin containing biphenyl skeleton | 0 | 0 | 0 | 38 | 0 | 0 | 0 |
| | (A2) component | HPC-9500P | DIC | Phenol resin containing naphthalene skeleton | 31 | 31 | 31 | 0 | 31 | 31 | 31 |
| | | GPH-103 | Nippon Kayaku | Phenol resin containing biphenyl skeleton | 0 | 0 | 0 | 32 | 0 | 0 | 0 |
| | (B) component | PMS-12-82 | Nagase ChemteX | Epoxy-modified acryl resin having Mw of 500000 | 30 | 30 | 30 | 30 | 30 | 30 | 30 |
| | Solvent | MEK | — | Methyl ethyl ketone | 190 | 190 | 190 | 190 | 190 | 190 | 190 |
| | Additive | SPB-100 | Otsuka Chemical | Phosphorus flame retardant | 19 | 19 | 19 | 19 | 0 | 19 | 19 |
| | (C1) component | SC2500GNO | Admatechs | Isocyanate silane-treated silica | 50 | 0 | 50 | 50 | 50 | 50 | 0 |
| | | SC2500SEJ | Admatechs | Epoxy silane-treated silica | 0 | 50 | 0 | 0 | 0 | 0 | 0 |
| | (C2) component | SC2500SVJ | Admatechs | Vinyl silane-treated silica | 0 | 0 | 5 | 0 | 0 | 0 | 50 |
| | | YA050C-MJE | Admatechs | Methacryl silane-treated silica | 5 | 5 | 0 | 5 | 5 | 0 | 0 |
| Board property | Heat resistance after moisture absorption | Duration of moisture absorption (h) | | 0 | S | S | S | S | S | S | S |
| | | | | 12 | S | S | S | S | S | A | A |
| | | | | 24 | S | S | S | S | S | A | A |
| | Dispersibility | SEM | | — | Good | Good | Good | Good | Good | Poor | Poor |
| | Peak top temperature in tanδ ≥ 0.05 | DMA | | ° C. | 30 246 | 32 249 | 35 242 | 33 176 | 40 261 | 30 246 | 30 249 |
| | Elastic modulus | DMA | Room temperature | GPa | 13 | 13 | 13 | 11 | 14 | 12 | 12 |

TABLE 1-continued

|  | Product number | Manufacturer | Detail |  | Example 1 | Example 2 | Example 3 | Example 4 | Example 5 | Comparative example 1 | Comparative example 2 |
|---|---|---|---|---|---|---|---|---|---|---|---|
| Coefficient of thermal expansion | TMA | 50-100° C. | ppm/° C. | | 6.8 | 6.5 | 6.6 | 6.9 | 7.2 | 6.3 | 6.5 |
| Tensile elongation percentage | Autograph | Room temperature | % | | 10 | 10 | 10 | 12 | 9 | 10 | 10 |
| Tensile rupture strength | Autograph | Room temperature | MPa | | 180 | 177 | 178 | 189 | 202 | 174 | 170 |
| Flame retardancy | UL94 | Vertical test | — | | V-0 | V-0 | V-0 | V-0 | All burned | V-0 | V-0 |

As apparent from the Table 1, the dispersibility of the inorganic filler was better in the examples 1 to 5, compared to the comparative examples 1 and 2. Therefore, it was determined that the heat resistance after moisture absorption and the tensile rupture strength were excellent in the examples 1 to 5.

By comparing the examples 1 and 2, it was determined that the heat resistance after moisture absorption can be improved in both cases where the silane coupling agent in the (C1) component has an isocyanate group and where the silane coupling agent in the (C1) component has an glycidyl group.

By comparing the examples 1 and 3, it was determined that the heat resistance after moisture absorption can be improved in both cases where the silane coupling agent in the (C2) component has a vinyl group and where the silane coupling agent in the (C2) component has an methacryloyl group.

By comparing the examples 1 and 4, it was determined that the heat resistance after moisture absorption can be improved in both cases where the (A1) component and the (A2) component have a naphthalene skeleton and where the (A1) component and the (A2) component have a biphenyl skeleton.

By comparing the examples 1 and 5, it was determined that the heat resistance after moisture absorption can be improved regardless of the existence of the phosphorus flame retardant.

REFERENCE SIGNS LIST

1 Prepreg
2 Metal-clad laminated board
3 Printed wiring board
4 Resin composition
5 Woven cloth substrate
6 Metal foil
7 Conductive pattern
51 Warp
52 Weft

The invention claimed is:
1. A prepreg comprising:
a woven cloth substrate; and
a semi-cured product of a resin composition impregnated into the woven cloth substrate,
the resin composition containing: at least one of an (A1) component and an (A2) component; a (B) component; a (C1) component; and a (C2) component,
the (A1) component being an epoxy resin having at least one of a naphthalene skeleton and a biphenyl skeleton,
the (A2) component being a phenol resin having at least one of a naphthalene skeleton and a biphenyl skeleton,
the (B) component being a high molecular weight polymer which has a structure represented by at least a (b2) formula and a (b3) formula out of a (b1) formula, the (b2) formula, and the (b3) formula and has a weight average molecular weight of 200000 to 850000,

[Chemical formula 1]

(b1)

(b2)

(b3)

x in the (b1) formula, y in the (b2) formula and z in the (b3) formula satisfying a following relationship, x:y:z (molar fraction)=0:0.95:0.05 to 0.2:0.6:0.2 (note that x+y+z≤1, 0≤x≤0.2, 0.6≤y≤0.95, and 0.05≤z≤0.2 being satisfied), in the (b2) formula, R1 including a hydrogen atom or a methyl group, and R2 structures including at least one structure of a glycidyl group and an epoxylated alkyl group out of a hydrogen atom, an alkyl group, a glycidyl group, and an epoxylated alkyl group, R1 including a hydrogen atom or a methyl group, and R2 including at least one of a glycidyl group and an epoxylated alkyl group out of a hydrogen atom, an alkyl group, a glycidyl group, and an epoxylated alkyl group, in the (b3) formula, R3 being a hydrogen atom or a methyl group, and R4 being Ph (a phenyl group), —COOCH$_2$Ph, or —COO(CH$_2$)$_2$Ph, the (C1) component being a first filler obtained by treating surfaces of a first inorganic filler with a first silane coupling agent represented by a (c1) formula,

[Chemical Formula 2]

$(R6)Si(R5)_3$ (C1)

in the (c1) formula, R5 being a methoxy group or an ethoxy group, and R6 having an isocyanate group, a glycidyl group, or an amino group at an end of an aliphatic alkyl group with the number of carbon atoms larger than or equal to 3 and smaller than or equal to 18, the (C2) component being a second filler obtained by treating surfaces of a second inorganic filler with a second silane coupling agent represented by a (c2) formula,

[Chemical Formula 3]

(R8)Si(R7)₃ (c2)

in the (c2) formula, R7 being a methoxy group or an ethoxy group, and R8 having a methacryloyl group or a vinyl group at an end of an aliphatic alkyl group with the number of carbon atoms larger than or equal to 3 and smaller than or equal to 18.

2. The prepreg according to claim 1, wherein the (C1) component or the (C2) component is a nanofiller having an average particle size of smaller than or equal to 100 nm.

3. The prepreg according to claim 2, wherein an amount of the nanofiller is within a range of 1 to 30 parts by mass with respect to 100 parts by mass of a total of the (A1) component, the (A2) component, and the (B) component.

4. The prepreg according to claim 1, wherein the resin composition does not contain an inorganic filler having an average particle size of larger than or equal to 45 μm.

5. The prepreg according to claim 1, wherein a weight ratio of a total of the (A1) component and the (A2) component to the (B) component is within a range of 90:10 to 50:50.

6. The prepreg according to claim 1, wherein a total amount of the (C1) component and the (C2) component is less than or equal to 80 weight % with respect to a total amount of the resin composition.

7. The prepreg according to claim 1, wherein a weight ratio of the (C1) component to the (C2) component is within a range of 98:2 to 60:40.

8. The prepreg according to claim 1, wherein the (A1) component and the (A2) component are not miscible with the (B) component and are phase-separated from the (B) component.

9. The prepreg according to claim 1, wherein an epoxy value of the (B) component is within a range of 0.01 to 0.80 eq/kg.

10. The prepreg according to claim 1, wherein the (B) component does not have an unsaturated bond between adjacent carbon atoms.

11. The prepreg according to claim 1, wherein the resin composition further comprises a phosphorus flame retardant.

12. The prepreg according to claim 1, wherein a thickness of the woven cloth substrate is within a range of 10 to 200 μm.

13. The prepreg according to claim 1, wherein a ratio of loss modulus to storage modulus is larger than or equal to 0.05 in a temperature range of lower than or equal to 100° C. and a temperature range of higher than or equal to 200° C., under a cured condition of the resin composition.

14. The prepreg according to claim 1, wherein a tensile elongation percentage of the prepreg in a oblique direction of 45° to warp or weft of the woven cloth substrate is larger than or equal to 5%, under the cured condition of the resin composition.

15. A metal-clad laminated board comprising:
a cured product of the prepreg according to claim 1; and
a metal foil bonded to the cured product.

16. A printed wiring board comprising:
a cured product of the prepreg according to claim 1; and
a conductive pattern provided on the cured product.

* * * * *